United States Patent [19]
Yamada et al.

[11] 3,943,467
[45] Mar. 9, 1976

[54] AMPLITUDE LIMITER CIRCUIT

[75] Inventors: Takahiko Yamada; Tadahiko Sakabe, both of Tokyo, Japan

[73] Assignee: Nippon Electric Company, Limited, Tokyo, Japan

[22] Filed: Apr. 22, 1975

[21] Appl. No.: 570,313

[30] Foreign Application Priority Data
Apr. 25, 1974 Japan.............................. 49-47335

[52] U.S. Cl................... 333/17 L; 307/237; 333/10
[51] Int. Cl.²................... H03G 11/06; H03G 11/02
[58] Field of Search............ 333/10, 17 L; 307/237, 307/264

[56] References Cited
UNITED STATES PATENTS 3,297,882 1/1967 Broadhead, Jr. ........... 333/17 L UX
3,621,400 11/1971 Paciorek et al. ............... 333/10 UX

*Primary Examiner*—Paul L. Gensler
*Attorney, Agent, or Firm*—Sughrue, Rothwell, Mion & Zinn

[57] ABSTRACT

An amplitude limiter circuit utilizing two sets of seriesdiode limiter circuits is disclosed. Each diode circuit has a pair of diodes in series but in abutting polarity. An input signal is applied through a phase converter with equal amplitudes and in opposite phases to each other to the diode circuits and a bias current is applied to each pair of diodes. To obtain an output signal having its level variation suppressed the currents passing through the parallel capacitances of the diodes in each circuit are offset with each other thereby resulting in an output signal not being subject to a shift in response to the variation of the input signal level.

2 Claims, 8 Drawing Figures

AMPLITUDE LIMITER CIRCUIT

BACKGROUND OF THE INVENTION

1. Field of the Invention

This invention relates to an amplitude limiter circuit for a transmission signal in the field of microwave communications, and more particularly to an amplitude limiter circuit to be used for a frequency-modulated wave or a phase-modulated wave in the microwave frequency band.

2. Prior Art

In general, a frequency-modulated wave or a phase-modulated wave (hereinafter referred to simply as an angle-modulated wave) received by a receiver in a radio communication system is often associated with an amplitude variation, and accordingly, for demodulation it is necessary to insert an amplitude limiter in the preceding stage of the demodulator thereby to preliminarily remove the amplitude variation.

Heretofore, as the above-referred type of amplitude limiter, is known a series diode type of amplitude limiter circuit, in which a pair of diodes connected in series with opposite polarities to each other achieve the amplitude limiting function while a current is passed from a constant current source through said diodes. This limiter circuit is constructed in such manner that electric currents in the forward direction are normally passed through both of said pair of diodes from a constant current source, thereby to automatically vary the series resistance values of the pair of diodes in response to an input signal level so as to suppress an output level variation. Thus, the pair of the diodes achieves the above-mentioned self-compensation effect. However, as the frequency of the input signal becomes higher, the influence of a phase-advanced current caused by a parallel capacitance of the diode cannot be neglected, resulting in an undesirable change of the phase of the output signal caused by the input signal level variation. Such an adverse effect is generally called "AM-PM conversion."

SUMMARY OF THE INVENTION

An object of the present invention is to provide a series-diode type amplitude limiter circuit in which the AM-PM conversion would not occur even when the input amplitude variation is present.

According to one feature of the present invention, two sets of series-diode type amplitude limiter circuits are provided and an input signal is applied to the respective amplitude limiter circuit through a phase converter circuit with equal amplitudes and in opposite phases to each other. The respective outputs of these amplitude limiter circuits are connected to a common load so that they may be added to each other. In this circuit structure, diodes having equal characteristics are used for the respective diode pairs in both amplitude limiter circuits, with different bias currents given to respective diode pairs. According to the present invention, the currents passing through the parallel capacitances of the diodes in the respective amplitude limiter circuits are always offset with each other, and consequently, the output signal is not subjected to phase-shift in response to the variation of the input signal level, whereby an output signal having its level variation suppressed can be obtained.

Above-mentioned and other features and objects of the present invention will become more apparent by reference to the following description taken in conjunction with the accompanying drawings, in which:

DESCRIPTION OF THE PREFERRED EMBODIMENT

Figure 1:
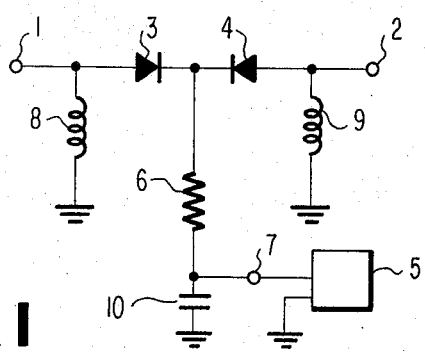
FIG. 1 is a schematic circuit diagram showing a series-diode type amplitude limiter circuit in the prior art.

To describe a series-diode type amplitude limiter circuit in the prior art with reference to FIG. 1, between an input terminal 1 and an output terminal 2 are connected a pair of diodes 3 and 4 in series. The diodes 3 and 4 are connected with opposite polarities to each other, and in the illustrated example, the cathodes of the respective diodes are connected to each other. To these diodes 3 and 4 are fed forward currents from a common bias current source 5. To this end, the junction between the diodes 3 and 4 is connected through a resistor 6 to a negative terminal 7 of the bias current souce 5, and the respective anode sides of the diodes 3 and 4 are grounded through D.C. by-pass coils 8 and 9, respectively, for blocking A.C. currents. The junction between the resistor 6 and the terminal 7 is grounded via an A.C. by-pass capacitor 10. Assuming now that the input signal applied to the input terminal 1 is an unmodulated carrier wave, the input signal level increase results in the increase in the current flowing through the diode 3 and the decrease in the current flowing through the diode 4, so that the output signal is suppressed at the same fixed level. This is caused by the fact that the sum of the currents flowing through the diodes 3 and 4, respectively, is maintained at a constant value which is determined by the current supplied through the resistor 6 from the bias current source 5. The constant current supply characteristics can be realized, for instance, by employing a battery or other constant voltage sources as the bias current source 5 and also by selecting the resistance value of the resistor 6 at a far higher value than the internal resistance of the diodes 3 and 4, because a substantially constant current will then flow through the resistor 6 regardless of how the distribution of the current between the diodes 3 and 4 is varied. On the other hand, since the diodes employed in this limiter circuit have such characteristics that the resistance may be reduced as the forward current is increased, if bias currents in the forward direction are passed through the diodes 3 and 4 via a constant current circuit, then it will be seen that the resistance values of the diodes 3 and 4 are varied in the opposite directions to each other in response to a level change of the input signal. Accordingly, by appropriately adjusting the bias currents flowing through the diodes 3 and 4, a favorable amplitude limiting function can be realized.

Figure 2:
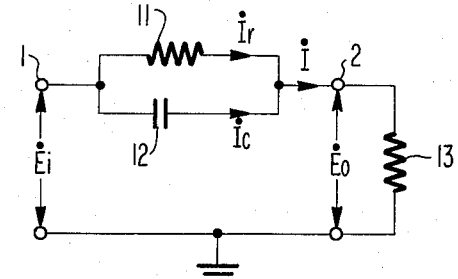
FIG. 2 is an equivalent circuit diagram for the amplitude limiter circuit shown in FIG. 1.
Figure 3:
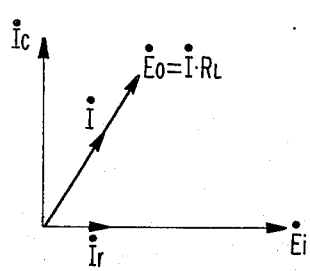
FIG. 3 is a vector diagram showing the relation between the voltage and current arising in the equivalent circuit shown in FIG. 2.

However, practically the diodes 3 and 4 include not only a resistive component but also a capacitive component in parallel, and therefore, the influence of the capacitive component upon the amplitude limiting function will be considered with reference to FIG. 2 which shows an equivalent circuit of the amplitude limiter circuit in FIG. 1. In FIG. 2, between the input terminal 1 and the output terminal 2 is connected a resistor 11 having an equivalent resistance R that is determined by the voltage-current characteristics of the diodes 3 and 4, and in parallel to the resistor 11 is connected a capacitor 12 having an equivalent parallel capacitance C of the diodes 3 and 4. Between the output terminal 2 and the ground is connected a resistive load 13 having a resistance $R_L$ that was omitted in FIG. 1. An input A.C. voltage at the input terminal 1 is represented by $\dot{E}_i$, an output A.C. voltage at the output terminal 2 is represented by $\dot{E}_o$, a current flowing through the resistor 11 is represented by $\dot{I}_r$, a current flowing through the capacitor 12 is represented by $\dot{I}_c$, and the sum of the currents $\dot{I}_r$ and $\dot{I}_c$ is represented by $\dot{I}$. Taking the input voltage $\dot{E}_i$ as a reference vector as shown by the vector diagram in FIG. 3, the current $\dot{I}_r$ and the voltage $\dot{E}_i$ are in phase with each other if $R >> R_L$ and $1/(\omega c) >> R_L$, the current $\dot{I}_c$ is advanced in phase by 90° with respect to the current $\dot{I}_r$ and the voltage $\dot{E}_i$, and the current $\dot{I}_c + \dot{I}_r = \dot{I}$ is advanced in phase by an angle:

$$\theta = \tan^{-1} \frac{|\dot{i}_c|}{|\dot{I}_r|} = \tan^{-1} \omega CR \qquad (1)$$

with respect to the current $\dot{I}_r$, where $\omega$ represents an angular frequency of the input A.C. signal. Accordingly, the output A.C. voltage $\dot{E}_o = \dot{I} \times R_L$ is in-phase with the current $\dot{I}$. Thus it is obvious that the phase angle $\theta$ of the output A.C. voltage $\dot{E}_o$ with respect to the input A.C. voltage $\dot{E}_i$ is dependent upon all of the angular frequency $\omega$, the parallel capacitance C of the diodes and the diode resistance R. As described previously, in this amplitude limiter circuit, in response to variation of the input level, while the variation of the resistive current $\dot{I}_r$ can be suppressed, the capacitive current $\dot{I}_c$ would vary, resulting in variation of the phase angle $\theta$, and thus the so-called AM-PM conversion would arise. Furthermore, it is seen that the AM-PM conversion characteristics are dependent upon the frequency. While the input signal was dealt with as an unmodulated carrier wave in the above description, in case that the input A.C. signal is an angle-modulated carrier wave, then in addition to a correct angular-modulation component, an unnecessary angular-modulation component is added by passing the input signal through this amplitude limiter, which becomes a source of noise.

Figure 4:
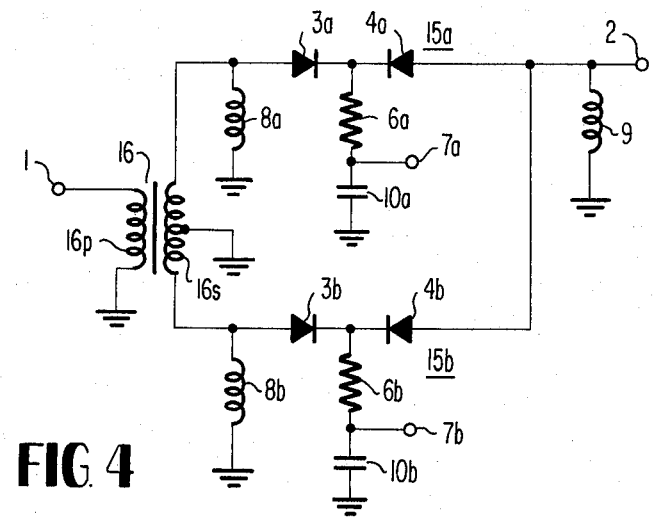
FIG. 4 is a schematic circuit diagram showing one preferred embodiment of the present invention.

Referring now to FIG. 4, an amplitude limiter circuit according to the present invention is shown. Each of two sets of amplitude limiter circuits 15a and 15b has the same construction as that illustrated iN FIG. 1, and therefore, like structural elements are denoted by like reference numerals with suffixes a and b added. However, a D.C. by-pass coil 9 is provided in common to both the limiter circuit 15a and 15b, and accordingly, the anodes of the diodes 4a and 4b are connected to each other and also connected to an output terminal 2. An input A.C. signal applied to an input terminal 1 is fed to the limiter circuit 15a and 15b with opposite polarities to each other. To this end the input terminal 1 is grounded through a primary winding 16p of a phase-inverting transformer 16, a center tap of a secondary winding 16s of the transformer 16 being grounded, and one end of the secondary winding 16s is connected to an anode of a diode 3a in the limiter circuit 15a, while the other end is connected to an anode of a diode 3b in the limiter circuit 15b. In the above-described arrangement, though the input signals applied to the respective circuits 15a and 15b with opposite polarities are set at the same level, if the D.C. bias currents for the diodes 3a and 4a and for the diodes 3b and 4b are selected equal to each other, then at the output terminal 2 the outputs of the circuits 15a and 15b are offset with each other, resulting in no input. In order to obtain an output, a potential difference is given between terminals 7a and 7b to make the D.C. bias currents for the diodes 3a and 4a and for the diodes 3b and 4b different from each other. As a result, even if the input signal level is varied, the influences of the parallel capacitances of the diodes upon the output signal are offset between the circuits 15a and 15b, and thereby an output signal having its level variations as well as its phase-angle variation other than an angular modulation suppressed, can be derived from the output terminal 2.

Figure 5:
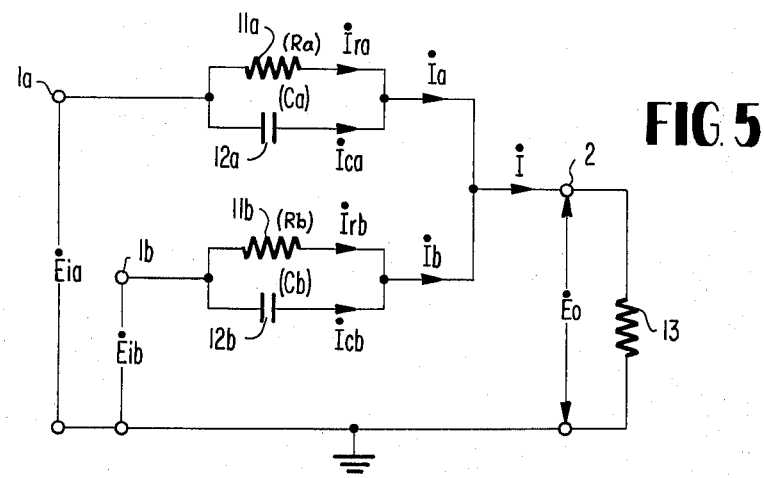
FIG. 5 is an equivalent circuit diagram for the amplitude limiter circuit shown in FIG. 4.
Figure 6:
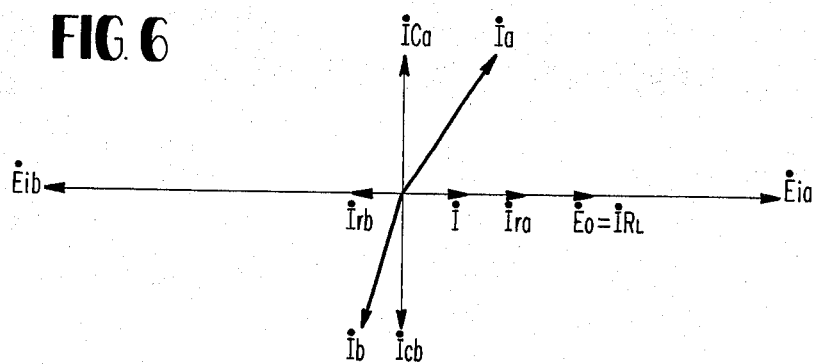
FIG. 6 is a vector diagram showing the relation between the voltage and current arising in the equivalent circuit shown in FIG. 5.

The operation of the above-described amplitude limiter circuit will be explained with reference to FIG. 5 which depicts an equivalent circuit of the amplitude limiter circuit according to the present invention. In FIG. 5, component parts corresponding to those appearing in FIG. 2 are identified by like reference numerals with a suffix $a$ added with respect to the circuit 15a and by like reference numerals with a suffix $b$ added with respect to the circuit 15b. However, input terminals 1a and 1b, respectively, correspond to the opposite ends of the secondary winding 16s of the transformer 16 in FIG. 4, where A.C. voltage signals $\dot{E}_{ia}$ and $\dot{E}_{ib}$ having the same frequency and the same amplitude but being 180° out-of-phase to each other would appear. Accordingly, the voltage and current vectors appearing in the circuits 15a and 15b are as shown in FIG. 6. Incidentally, for the simplicity of explanation, the illustrated relation of each vector is on the assumption that $R_a >> R_L$, $R_b >> R_L$, $1/(\omega C_a) >> R_L$ and $1/(\omega C_b) >> R_L$. The parallel capacitances $C_a$ and $C_b$ of the diodes are equal to each other because the diodes 3a and 4a and the diodes 3b and 4b have the same characteristics, so that the relation of $|\dot{I}_{ca}| = |\dot{I}_{cb}|$ is valid regardless of the input level and also regardless of the frequency, these $\dot{I}_{ca}$ and $\dot{I}_{cb}$ being out-of-phase to each other to offset each other. Consequently, even if the magnitude $|\dot{I}_{ra}|$ and $|\dot{I}_{rb}|$ are different from each other, the output voltage $\dot{E}_o$ is always in-phase with the input voltage $\dot{E}_{ia}$, and there is no possibility of the phase variation of the output A.C. voltage signal $\dot{E}_o$ caused by the input signal level change.

It is known that the capacitance C as measured across one diode can be approximated by the following equation:

$$C = S \{ \epsilon q N / 2(\phi\, d - V) \}^{1/2}$$

where $S$ represents an area of a barrier; $q$, a charge of an electron; $\epsilon$, a dielectric constant of a semiconductor; $N$, an impurity concentration of a semiconductor; $\phi d$, a diffusion potential; and $V$, an external voltage. Therefore, assuming that diodes having identical characteristics are used, it is obvious that the capacitances $C_a$ and $C_b$ as indicated in FIG. 5 are equal to each other so long as the external voltages $V$ are equal. Then taking into consideration that the external voltage applied across the diode is a sum of the D.C. voltage $V_{DC}$ and the A.C. voltage $V_{AC}$, the difference in the external voltage between the diode pair $3a$ and $4a$ and the other diode pair $3b$ and $4b$ is only the difference in the D.C. voltage $V_{DC}$ because the A.C. voltages $V_{AC}$ are equal to each other. Here, it is to be noted that the difference in the D.C. voltages $V_{DC}$ is the difference in the D.C. voltage drops across the diodes because the diodes $3a$ and $4a$ and the diodes $3b$ and $4b$ are forward biased. However, within the region of variation of the D.C. voltage $V_{DC}$ where the diodes achieve the amplitude limiting function, the condition of $V_{DC} << V_{AC}$ is satisfied, and so the influence of the D.C. voltage $V_{DC}$ can be neglected.

From the afore-mentioned analysis it is obvious that the parallel capacitances $C_a$ and $C_b$ as indicated in FIG. 5 are always equal to each other regardless of a level variation of the input signal. Therefore, the absolute values of the capacitive currents $i_{ca}$ and $i_{cb}$ are always equal to each other, and thus they are offset with each other.

Figure 7:
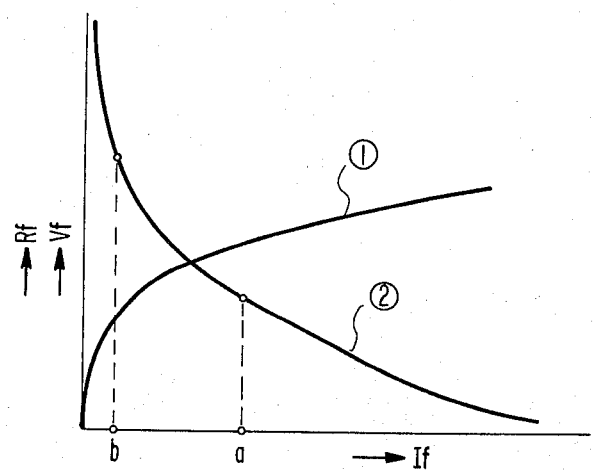
FIG. 7 is a diagram for the explanation of the characteristics and operations of the diodes employed in the amplitude limiter circuit according to the present invention.

The characteristics and functions of the diodes used in the amplitude limiter circuit illustrated in FIG. 4 will be described with reference to FIG. 7, in which a forward current $I_f$ flowing through a diode is taken along the abscissa, while a voltage $V_f$ across a diode and a resistance $R_f$ of the same are taken along the ordinate. Curve 1 in FIG. 7 is an $I_f$-$V_f$ characteristic curve which represents the variation of the voltage in accordance with the current, while curve 2 is an $I_f$-$R_f$ characteristic curve which represents the variation of the resistance in accordance with the current. A forward bias current flowing through the diodes $3a$ and $4a$, respectively, used in the circuit $15a$ in the amplitude limiter circuit is selected at point $a$ indicated on the abscissa, while another bias current flowing through the diodes $3b$ and $4b$, respectively, used in the circuit $15b$ is selected at point $b$ that is lower than the point $a$. Consequently, the current $i_{ra}$ flowing through the diodes $3a$ and $4a$ in the circuit $15a$ is made considerably larger than the current $i_{rb}$ flowing through the diodes $3b$ and $4b$ in the circuit $15b$ as shown in the vector diagram of FIG. 6 corresponding to the equivalent circuit in FIG. 5. It will be also understood that the current $i_{rb}$ flowing through the equivalent diode resistor in the circuit $15b$ is chosen at a low value, because it is out-of-phase to the current $i_{ra}$ flowing through the equivalent diode resistor in the circuit $15a$, and thereby lowering of the output level is prevented.

Figure 8:
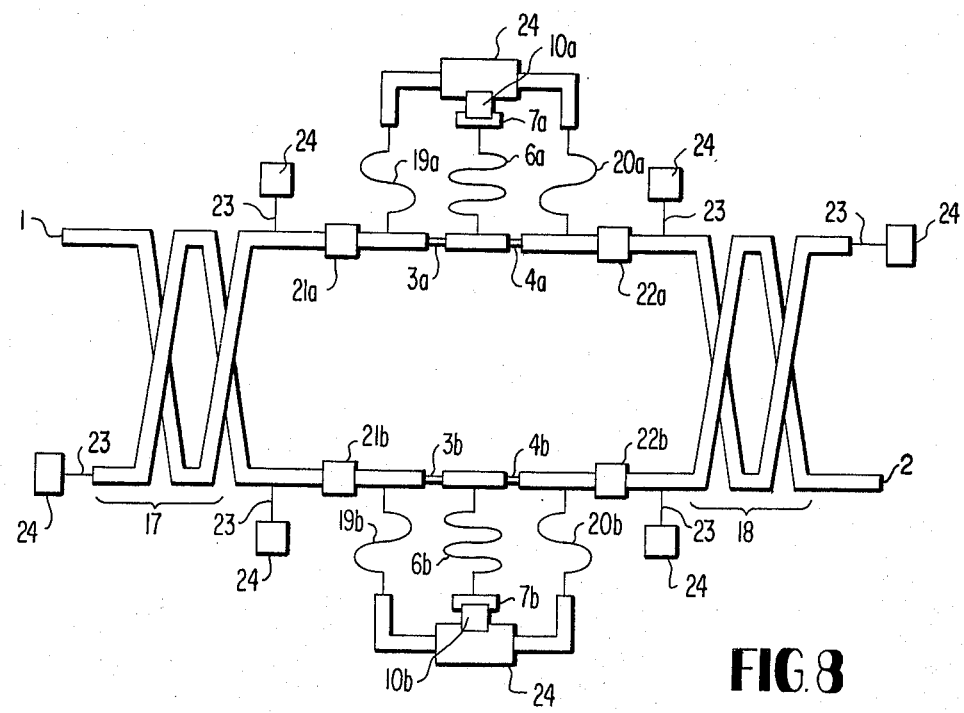
FIG. 8 is a schematic circuit diagram showing another preferred embodiment of the present invention as applied to a microwave region.

Another preferred embodiment of the present invention as applied to a microwave frequency region is shown in FIG. 8, in which reference numeral 1 designates an input terminal; 2, an output terminal; $3a$, $3b$, $4a$ and $4b$, Shottky barrier diodes, respectively; $6a$ and $6b$, resistors formed of thin films for use in an integrated circuit; $7a$ and $7b$, bias input terminals; and $10a$ and $10b$, capacitors formed of thin films. Reference numerals 17 and 18, respectively, represent $-3$ dB hybrid couplers of strip line type formed of thin films. Here the phase difference between the signals at the two output terminals of the hybrid coupler 17 is selected at 90°, and also the difference between the phase shifts produced during the period in which the signals applied to the two input terminals of the hybrid coupler 18 are passed to the output terminal 2 is selected at 90°. As described, by combining the two hybrid couplers 17 and 18, at the composite output terminals 2 can be derived a sum of the current components flowing through the circuits $15a$ and $15b$, respectively, as added in an out-of-phase relationship. Reference numerals $19a$, $19b$, $20a$ and $20b$ designate resistors formed of thin films, numerals $21a$, $21b$, $22a$ and $22b$ designate capacitors formed of thin films, numeral 23 designates resistors having a resistance value equal to the load impedance, and numeral 24 designates terminals connected to a grounded base plate. The connections between the above-referred respective elements are all formed of strip lines and are opposed to the grounded base plate having a broad area with a dielectric sheet for an integrated circuit interposed therebetween.

By way of example, as a performance of the thus constructed amplitude limiter circuit of strip line type, operation characteristics of an amplitude compression factor of 26 dB with respect to an input level taken as a 0 dB reference and an AM-PM conversion factor of 0.5° or less per 1 dB have been obtained in the frequency range of 1.7 GHz ± 100 MHz.

As described above, the amplitude limiter circuit according to the present invention involves no phase shift or no frequency-dependent phase shift variation in the output signal, even if the level of the input signal is varied, because the influence of the AM-PM conversion caused by parallel capacitances of diodes can be neglected. In addition, while there has been no amplitude limiter circuit suitable for use in a microwave frequency region in the past, it has become possible to realize such an amplitude limiter circuit by employing the amplitude limiter circuit according to the present invention. Furthermore, the limiter circuit of the present invention has additional advantages that an excellent limiter characteristic can be easily obtained by simply adjusting the bias currents flowing through the diodes, and that the circuit does not necessitate an adjusting circuit for a phase shift. It is to be noted that as a phase inverter circuit, not only a transformer and a hybrid circuit, but also any circuit that is most suitable for the operating condition such as, for example, an amplifier, a cable, etc. could be used.

Since many modifications can be made in the above construction and many apparently widely different embodiments of this invention can be made withhout departing from the scope thereof, it is intended that all matter contained in the above description or shown in the accompanying drawings shall be interpreted as illustrative and not in a limiting sense.

What is claimed is:

1. An amplitude limiter circuit comprising, a phase inverter circuit having first and second terminals for branching an input signal into two components, said components having substantially equal amplitude and opposite polarities, first and second diode circuits connected between said first and second terminals respectively, a third terminal coupled to said first and second diode circuits for deriving an output signal therefrom, each of said diode circuits including a pair of diodes connected in series and with opposite polarities to each other and a constant current circuit connected to said pair of diodes so as to pass bias currents through said diodes from a junction point between said diodes; whereby constant current values for biasing said first and second diode circuits, respectively, are selected at different values from each other.

2. An amplitude limiter circuit comprising, an input-side hybrid coupler having first and second output terminals for branching an input signal into its first and second output components, said components having substantially an equal amplitude and a 90° phase difference, an output-side hybrid coupler including first and second input terminals for combining respective signals applied to said first and second input terminals with a phase shift difference of 90° from each other, a first diode circuit connected between said first output terminal of said input side hybrid coupler and said first input terminal of said output side hybrid coupler and including a first pair of diodes connected in series and with opposite polarities to each other and a constant current circuit connected to a central junction point between said pair of diodes, a second diode circuit connected between said second output terminal of said input-side hybrid coupler and said second input terminal of said output side hybrid coupler and including a second pair of diodes connected in series and with opposite polarities to each other and a constant current circuit connected to a central junction point between said pair of diodes; whereby the value of the constant current to be passed through said first diode circuit and the value of the constant current to be passed through said second diode circuit are selected at different values from each other.

* * * * *